(12) United States Patent
Ning (10) Patent No.: US 8,692,357 B2
(45) Date of Patent: Apr. 8, 2014

(54) SEMICONDUCTOR WAFER AND PROCESSING METHOD THEREFOR (75) Inventor: Xianjie Ning, Beijing (CN)

(73) Assignee: Semiconductor Mnaufacturing International (Beijing) Corporation (CN)

( * ) Notice: Subject to any disclaimer, the term of this patent is extended or adjusted under 35 U.S.C. 154(b) by 0 days.

(21) Appl. No.: 13/326,303

(22) Filed: Dec. 14, 2011

(65) Prior Publication Data

US 2013/0069205 A1    Mar. 21, 2013

(30) Foreign Application Priority Data

Sep. 20, 2011  (CN) .......................... 2011 1 0278871

(51) Int. Cl.
H01L 23/544 (2006.01)
H01L 29/06 (2006.01)
H01L 21/00 (2006.01)

(52) U.S. Cl.
USPC ........... 257/620; 257/622; 257/623; 257/626; 438/462

(58) Field of Classification Search
USPC .................. 257/618–628; 438/760–465
See application file for complete search history.

(56) References Cited

U.S. PATENT DOCUMENTS

| 5,119,171 | A | * | 6/1992 | Lesk et al. | 257/623 |
| 5,795,815 | A | * | 8/1998 | Vokoun et al. | 438/462 |
| 2003/0216009 | A1 | * | 11/2003 | Matsuura et al. | 438/460 |
| 2005/0173024 | A1 | * | 8/2005 | Brennan et al. | 148/33.2 |
| 2006/0073676 | A1 | * | 4/2006 | Chen et al. | 438/460 |
| 2007/0111477 | A1 | * | 5/2007 | Maruyama et al. | 438/460 |
| 2010/0207250 | A1 | * | 8/2010 | Su et al. | 257/620 |
| 2010/0252916 | A1 | * | 10/2010 | Chen et al. | 257/620 |
| 2011/0031591 | A1 | * | 2/2011 | Min et al. | 257/618 |

* cited by examiner

Primary Examiner — Fernando L Toledo
Assistant Examiner — Karen Kusumakar
(74) Attorney, Agent, or Firm — Innovation Counsel LLP (57) ABSTRACT A semiconductor wafer and a method which are capable of reducing chippings or cracks generated during the die sawing process. The semiconductor wafer comprises a plurality of dies formed on the semiconductor wafer in row and column directions and separated from each other by scribe lane areas, and a passivation layer formed on the plurality of dies and the scribe lane areas, wherein a groove structure is formed in the passivation layer. The groove structure includes grooves formed along the scribe lane areas, and corners of the passivation layer at intersections of the grooves being removed.

27 Claims, 6 Drawing Sheets

FIG. 4B

SEMICONDUCTOR WAFER AND PROCESSING METHOD THEREFOR

CROSS-REFERENCES TO RELATED APPLICATIONS

This application claims priority to Chinese Patent Application No. 201110278871.6, filed on Sep. 20, 2011 and entitled "Semiconductor Wafer and Processing Method Therefor", which is incorporated herein by reference in its entirety.

BACKGROUND OF THE INVENTION

1. Field of the Invention

This disclosure relates generally to a semiconductor wafer and a processing method therefor, and more particularly relates to a semiconductor wafer having a groove structure in a passivation layer and a method for processing the same that can reduce damages to corners of cut-out dies.

2. Description of the Related Art

In semiconductor device manufacturing processes, after many steps such as deposition, photolithography and etching, a plurality of dies, which are separated from each other by scribe lane areas, are formed on a semiconductor wafer.

Figure 1:
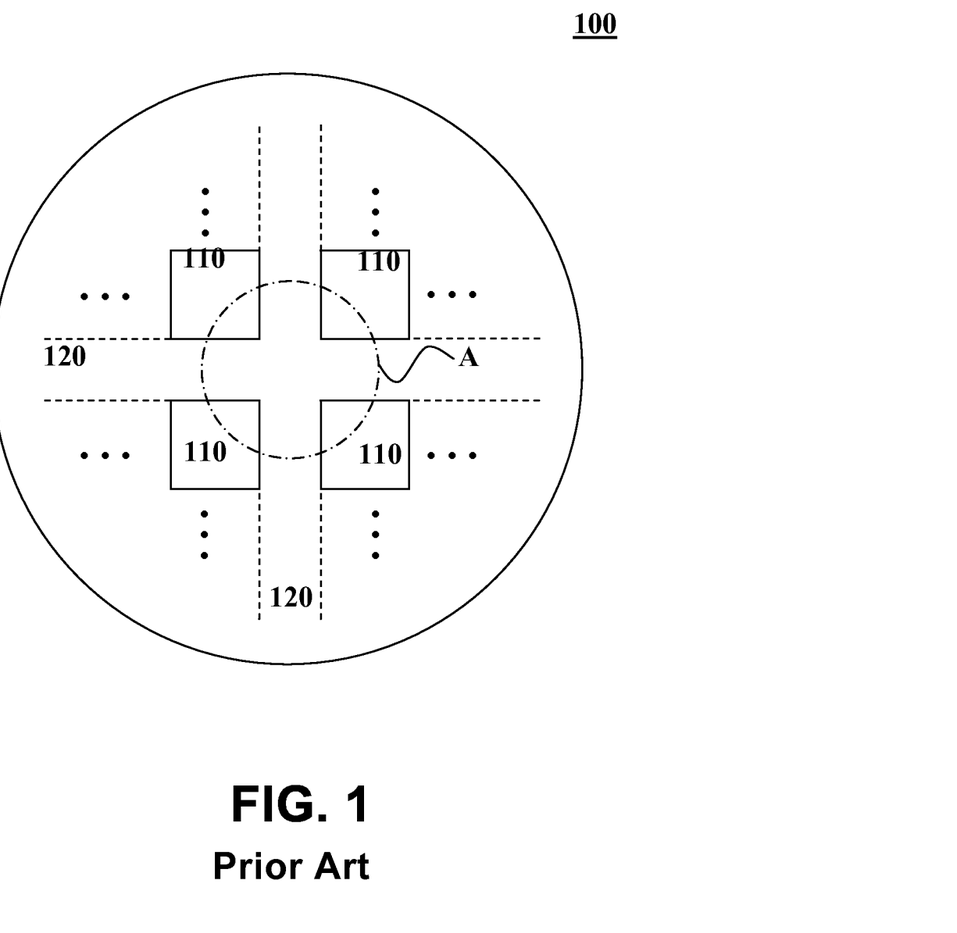
FIG. 1 is a schematic top view of a conventional semiconductor wafer.

FIG. 1 is a schematic top view of a conventional semiconductor wafer. As shown in FIG. 1, a semiconductor wafer 100 comprises a plurality of dies 110 formed thereon in row and column directions, and the plurality of dies 110 are separated from each other by scribe lane areas 120. Although four dies 110 are shown in FIG. 1 as an example, the number of the dies 110 is not limited thereto.

Before cutting along the scribe lane areas 120 to singulate the plurality of dies 110 from each other, a passivation layer is generally formed on the plurality of dies 110 and the scribe lane areas 120 to protect the dies 110 and the like.

Figure 2A:
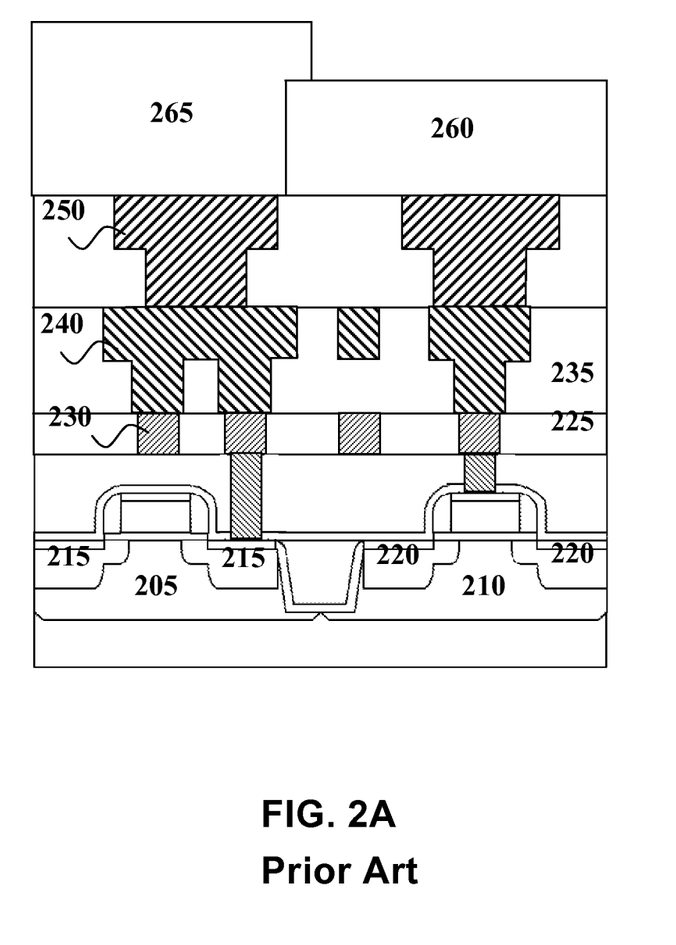
FIGS. 2A and 2B are schematic cross-sectional views of the conventional semiconductor wafer.
Figure 2B:
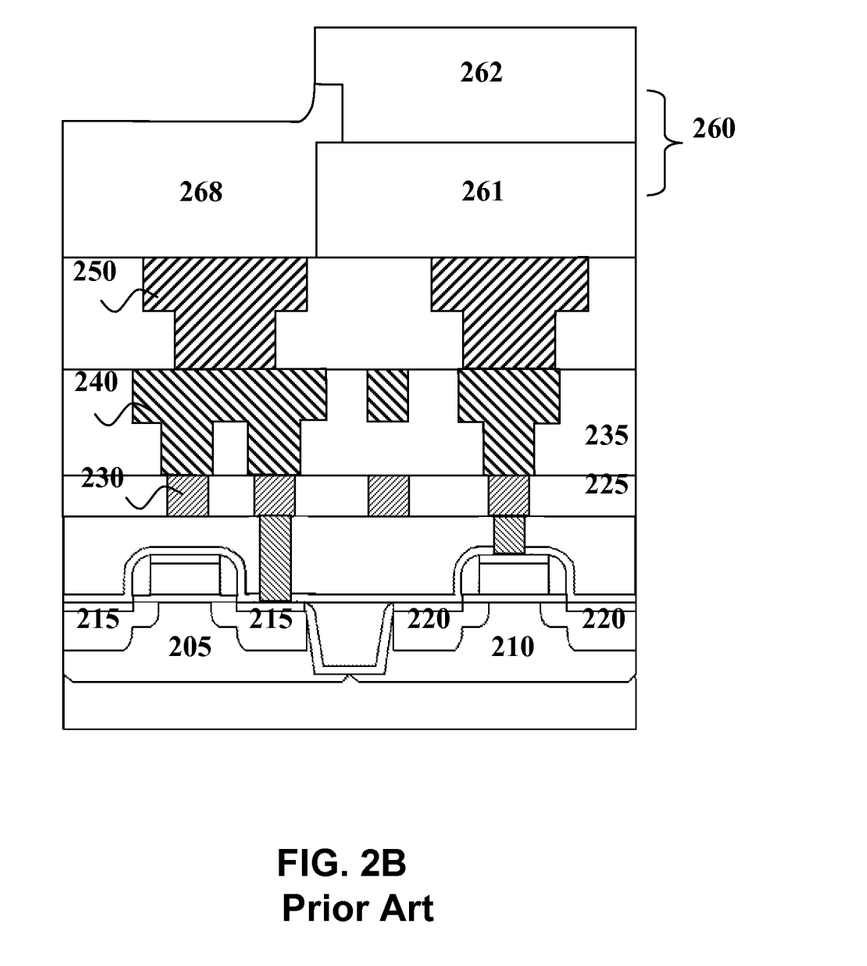

FIGS. 2A and 2B are schematic cross-sectional views of a conventional semiconductor wafer. As shown in FIGS. 2A and 2B, the semiconductor wafer may have an N well 205, a P well 210, a P+ region 215, an N+ region 220, inter-metal dielectric layers 225 and 235, metal layers 230 and 240, a top metal layer 250 and the like in a die area, for example. Furthermore, a passivation layer 260 is formed on the planarized top metal layer 250. Also, a pad window is usually formed in the passivation layer 260 to form a pad 265 (FIG. 2A) or 268 (FIG. 2B) therein. The difference between FIG. 2A and FIG. 2B lies in that, in FIG. 2A, the passivation layer 260 only comprises one passivation film, whereas in FIG. 2B, the passivation layer 260 comprises two passivation films 261 and 262, and a pad window is formed in each of the passivation films 261 and 262.

Thereafter, cutting is performed along the scribe lane areas 120 by using, for example, a rotating blade to singulate the plurality of dies 110 from each other (see FIG. 1).

The inventor of the present invention has conducted in-depth investigation on the above die sawing technique, and has found that the following problems exist: Due to the mechanical stress generated between the blade and the semiconductor wafer, chippings are likely to occur at die edges and cause cracks during the die-sawing process. This phenomenon is particularly pronounced at intersections of the scribe lane areas. Also, cracks at rough die edges are likely to propagate into the dies, thereby causing die deterioration or failure.

BRIEF SUMMARY OF THE INVENTION

Embodiments of the present invention provide a semiconductor wafer and a processing method therefor which are capable of reducing chippings or cracks generated during the die sawing process.

According to one aspect of present invention, a semiconductor wafer includes a plurality of dies formed on the semiconductor wafer in row and column directions and separated from each other by scribe lane areas; and a passivation layer formed on the plurality of dies and the scribe lane areas, wherein a groove structure is formed in the passivation layer, the groove structure comprising grooves formed along the scribe lane areas, and corner regions of the passivation layer at intersections of the grooves being removed.

Optionally, in the case the passivation layer comprises n passivation films, the groove structure is formed in m passivation films from a top of the passivation layer, where m and n are natural numbers, n≥2, 1≤m≤n.

Optionally, in the case the groove structure is formed in a plurality of passivation films, the sizes of the groove structure in respective passivation films are the same.

Optionally, in the case the groove structure is formed in a plurality of passivation films, the sizes of the groove structure in respective passivation films gradually decrease downwards from the top of the passivation layer.

Optionally, the removed corner regions of the passivation layer are right-angled isosceles triangles in shape.

Optionally, the corner regions of the passivation layer are located within the scribe lane areas before being removed.

Optionally, the corner regions of the passivation layer cover corners of corresponding dies before being removed.

Optionally, the grooves are formed in a middle region of the scribe lane areas.

Optionally, the grooves have a width in the range from 10 μm to 50 μm.

Optionally, the width of the grooves ranges from 25 μm to 40 μm.

Optionally, the scribe lane areas have no dummy metal material therein.

Optionally, the groove structure is not formed in regions on the scribe lane areas where monitoring patterns are to be disposed.

According to another aspect of the present invention, a processing method for a semiconductor wafer includes forming a plurality of dies on the semiconductor wafer in row and column directions, the plurality of dies being separated from each other by scribe lane areas; forming a passivation layer on the plurality of dies and the scribe lane areas; and forming a groove structure in the passivation layer, wherein the groove structure comprises grooves formed along the scribe lane areas, and corner regions of the passivation layer at intersections of the grooves are removed.

Optionally, the groove structure is formed in the passivation layer while a pad window is formed in the passivation layer.

Optionally, in the case the passivation layer comprises n passivation films, forming the groove structure in the passivation layer comprises forming the groove structure in m passivation films from a top of the passivation layer, where m and n are natural numbers, n≥2, 1≤m≤n.

Optionally, the groove structure is formed in each passivation film of the m passivation films from the top of the passivation layer while a pad window is formed in the each passivation film.

Optionally, in the case the groove structure is formed in a plurality of passivation films, the sizes of the groove structure in respective passivation films are the same.

Optionally, in the case the groove structure is formed in a plurality of passivation films, the sizes of the groove structure in respective passivation films gradually decrease downwards from the top of the passivation layer.

Optionally, after forming the groove structure, cutting is performed along the grooves so as to make the plurality of dies apart from each other.

Optionally, the removed corner regions of the passivation layer are right-angled isosceles triangles in shape.

Optionally, the corner regions of the passivation layer are located within the scribe lane areas before being removed.

Optionally, the corner regions of the passivation layer cover corners of corresponding dies before being removed.

Optionally, the grooves are formed in the middle of the scribe lane areas.

Optionally, the grooves have a width in the range from 10 µm to 50 µm.

Optionally, the width of the grooves ranges from 25 µm to 40 µm.

Optionally, the scribe lane areas have no dummy metal material therein.

Optionally, the groove structure is not formed in regions on the scribe lane areas where monitoring patterns are to be disposed.

Advantageously, by using embodiments of the present invention, chippings or cracks occurring during the die-sawing process can be reduced.

BRIEF DESCRIPTION OF THE DRAWINGS

The accompanying drawings, which are incorporated in and constitute a part of the specification, illustrate embodiments of this disclosure and, together with the description, serve to explain the principles of this disclosure.

It is noted that, in the accompanying drawings, for convenience of description, the sizes of respective components may not be drawn based on actual scales. Also, the same or similar reference signs represent the same or similar components in the accompanying drawings.

The objects, features and advantages of this disclosure will become apparent from the following detailed description of exemplary embodiments with reference to the accompanying drawings.

DETAILED DESCRIPTION OF THE INVENTION

Exemplary embodiments of this disclosure will be described in detail below with reference to the accompanying drawings. It shall be noted that the following description is merely illustrative and exemplary in nature, and is not intended to limit this disclosure, its applications or uses. The relative arrangement of components and steps, numerical expressions and numerical values set forth in the embodiments do not limit the scope of this disclosure unless it is otherwise specifically stated. In addition, techniques, methods and devices known by persons skilled in the art may not be discussed in detail, but are intended to be a part of the specification where appropriate.

According to an embodiment of the present invention, a groove structure is formed in a passivation layer, the groove structure comprising grooves formed along scribe lane areas, and corners (also referred as corner regions) of the passivation layer at intersections of the grooves being removed. Since the grooves are formed along the scribe lane areas, the mechanical stress that is generated between a blade and a semiconductor wafer during the die sawing process is reduced, which provides smoother die edges and reduces chippings or cracks occurring during the die sawing process. Furthermore, in the case the grooves are formed along the scribe lane areas, since the corners of the passivation layer at the intersections of the grooves are sharp, they generate chippings or cracks. In this disclosure, since the corners of the passivation layer at the intersections of the grooves are removed, chippings or cracks generated during the die sawing process can be further reduced.

Figure 3:
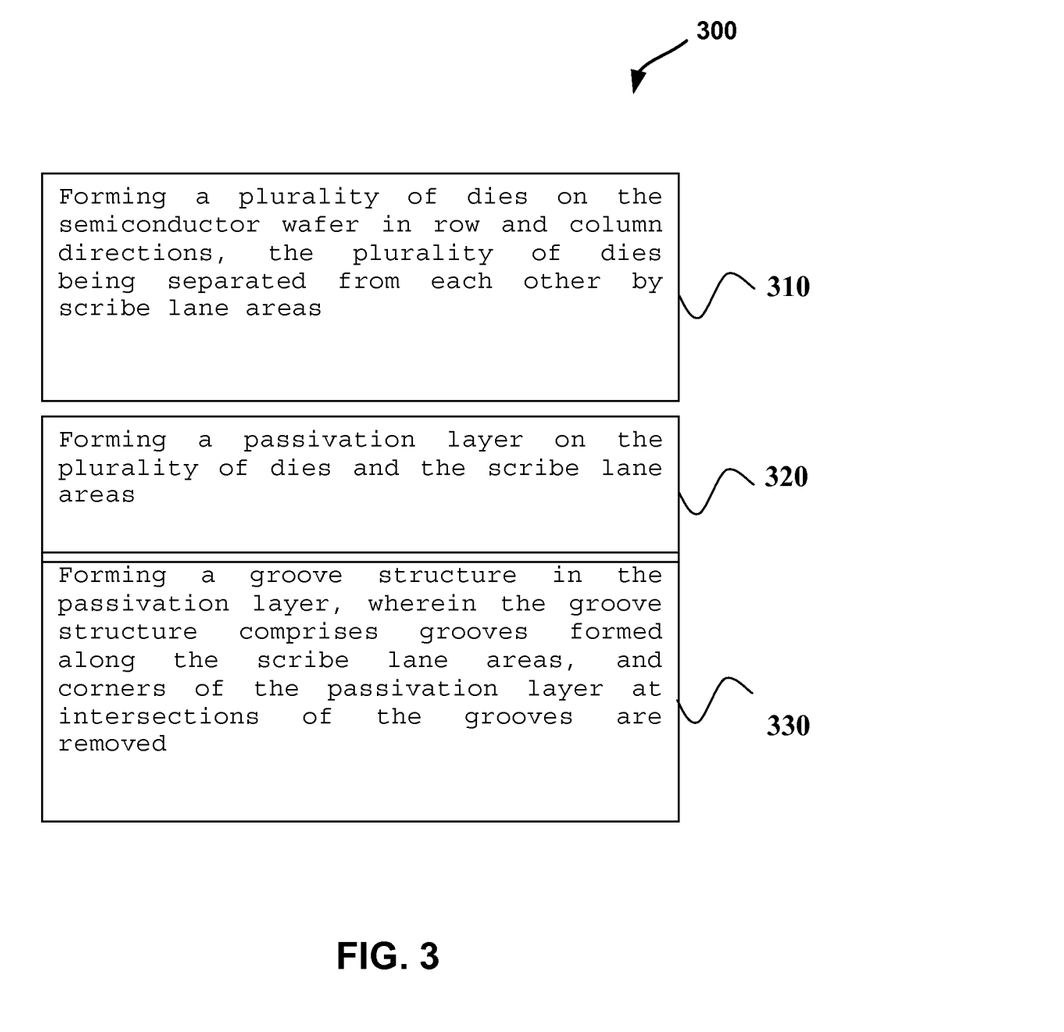
FIG. 3 schematically illustrates a flowchart illustrating a processing method for a semiconductor wafer according to an embodiment of the present invention.

FIG. 3 is a flowchart schematically illustrating a processing method 300 for a semiconductor wafer according to an embodiment of the present invention. It is understood from the following description that steps 310 and 320 in FIG. 3 are similar to those in the prior art, thus description will be made with reference to FIGS. 1, 2A and 2B.

Referring to FIG. 3, a plurality of dies (also referred as integrated circuit chips) 110 is formed on a semiconductor wafer 100 in row and column directions, the plurality of dies 110 being separated from each other by scribe lane areas 120 (see FIG. 1).

The semiconductor wafer 100 is not limited to any particular type. Semiconductor wafer 100 may be a silicon wafer, a germanium wafer, a gallium arsenide wafer, and the like. Similarly, dies 110 are not limited to any particular type. Dies 110 may be memory dies or integrated circuit chips having digital or analog circuits, memory, digital processing units, and a combination thereof.

As shown in FIG. 1, the plurality of dies 110 are formed in row and column directions and are separated from each other by the scribe lane areas 120, in order to be singulated into individual dies 110 along the scribe lane areas 120 later.

Next, in step 320 of FIG. 3, a passivation layer 260 is formed on the plurality of dies 110 and the scribe lane areas 120 (see FIGS. 2A and 2B).

The passivation layer 260 is used to protect the dies 110 formed in the semiconductor wafer 100 and the like. As shown in FIG. 2A, the passivation layer 260 may comprise one passivation film, or the passivation layer 260 may comprise two passivation films 261 and 262, as shown in FIG. 2B. Incidentally, the number of the passivation films contained in the passivation layer 260 is not limited thereto, and it may be more than two. Incidentally, each passivation film is not limited to a particular material. The passivation film may be, for example, formed of silicon nitride, silicon oxide or the like. Similarly, each passivation film is not limited to a particular thickness; and each passivation film itself may be a single-layered structure or a stacked structure.

A groove structure is formed in the passivation layer 260, wherein the groove structure comprises grooves formed along the scribe lane areas 120, and corners of the passivation layer at intersections of the grooves are removed (step 330).

Figure 4A:
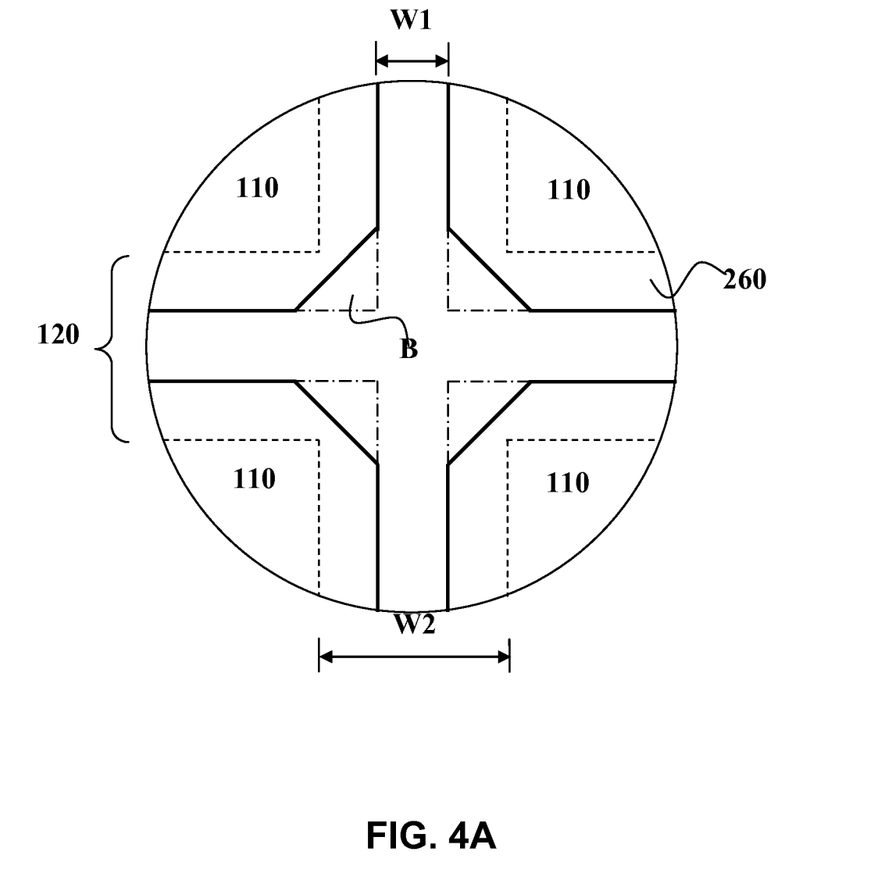
FIGS. 4A and 4B are schematic top views of a groove structure according to an embodiment of the present invention.
Figure 4B:
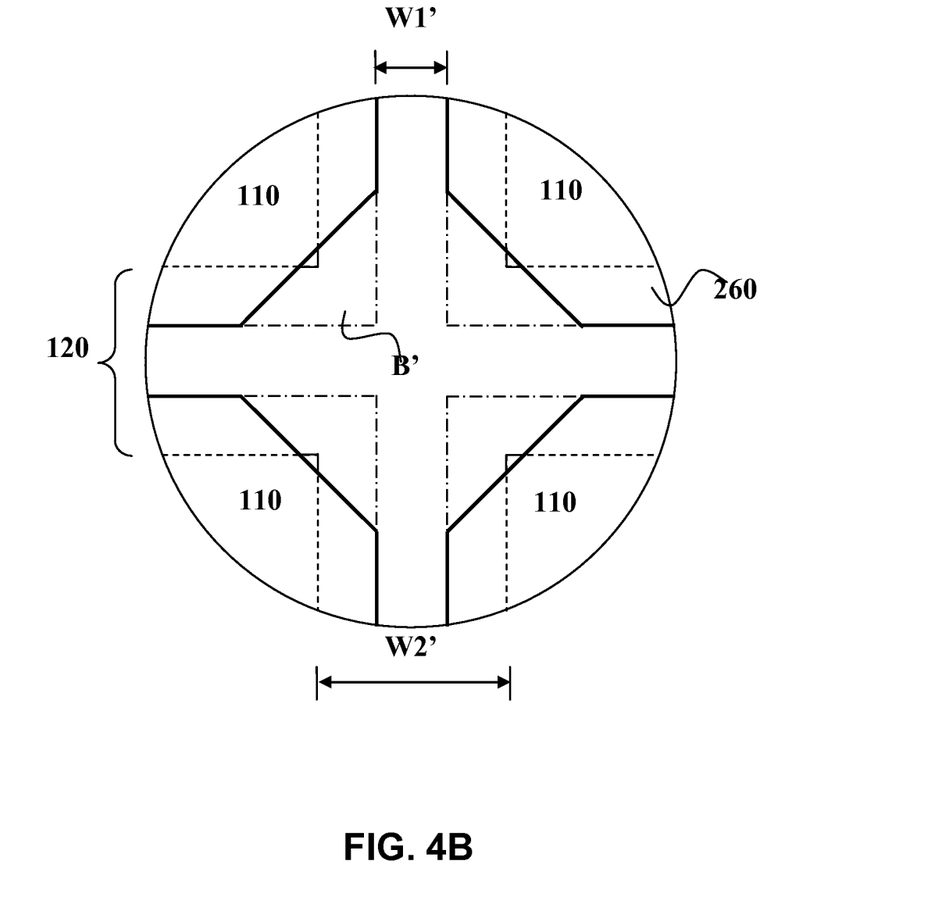

FIGS. 4A and 4B schematically illustrate the groove structure according to an embodiment of the present invention. For the sake of clarity, FIGS. 4A and 4B only illustrate a structure in an area A enclosed by a dotted line in FIG. 1. As shown in FIGS. 4A and 4B, the groove structure of this disclosure comprises the grooves formed along the scribe lane areas 120. The grooves can lower the mechanical stress generated between the blade and the semiconductor wafer during the die sawing process, thereby chippings or cracks generated during the die sawing process can be reduced. In addition, if the groove structure merely comprises the grooves formed along the scribe lane areas 120, sharp corners of the passivation layer will exist at the intersection of the grooves (see an area B shown by a dotted line in FIG. 4A and an area B' shown by a dotted line in FIG. 4B). The sharp corners of the passivation layer may cause chippings or cracks during the die sawing process. Therefore, in the groove structure of the present invention, the corners (or corner regions) of the passivation layer at the intersections of the grooves are removed as well to lower the sharpness in the proximity of such locations for the passivation layer, thereby chippings or cracks generated during the die sawing process can be further reduced.

Generally, the grooves formed along the scribe lane areas 120 are located within the scribe lane areas 120, and a width of the grooves formed along the scribe lane areas 120 (see W1 in FIG. 4A and W1' in FIG. 4B) is less than or equal to a width of the scribe lane areas 120 (see W2 in FIG. 4A and W2' in FIG. 4B) and is larger than or equal to a thickness of the cutting blade. Generally, the width of the scribe lane areas 120 ranges from about 60 μm to about 80 μm. In some embodiments of the present invention, the width of the grooves formed along the scribe lane areas 120 ranges from about 10 μm to about 50 μm. In a specific embodiment, the width of the grooves formed along the scribe lane areas 120 ranges from about 25 μm to about 40 μm. In some embodiments, the grooves are formed in a middle region of the scribe lane areas 120.

In other embodiments, the removed corner regions of the passivation layer can have any shape. In a specific embodiment, the removed corner regions of the passivation layer have a right-angled isosceles triangular shape (see the area B in FIG. 4A and the area B' in FIG. 4B).

Furthermore, the removed corner regions of the passivation layer are not limited to any particular size. In some embodiments, the corner regions of the passivation layer may be located within the scribe lane areas 120 before being removed. In an example embodiment, the corner regions do not extend beyond the corners of corresponding dies 110 (see FIG. 4A). In this case, after the corner regions of the passivation layer are removed, the dies 110 are still completely covered and protected by the passivation layer 260. In an alternative embodiment, the corner regions of the passivation layer may extend over the corners of the associated dies 110 before being removed (see FIG. 4B). In such a case, after the corner regions of the passivation layer are removed, portions of the corners of the dies 110 are exposed, but other portions of the dies 110 are still covered and protected by the passivation layer 260. Since semiconductor devices are not formed at the corners of the dies 110 generally, the performance of the dies 110 is not adversely affected.

In addition, as previously described with reference to FIGS. 2A and 2B, the passivation layer 260 may comprise a plurality of passivation films. In some embodiments of this disclosure, in the case where the passivation layer comprises n passivation films, the above-described groove structure may be formed in m passivation films from a top of the passivation layer, where m and n are natural numbers, n≥2, 1≤m≤n. That is, in the case where the passivation layer comprises a plurality of passivation films, it is possible to form the above-described groove structure only in a top passivation film, or in several passivation films from the top of the passivation layer, or in all of the passivation films. This is because chippings or cracks generated during the die sawing process can be reduced as long as the above-described groove structure is formed in the passivation layer 260, regardless of a depth of the above-described groove structure formed.

In some embodiments of this disclosure, in the event that the above-described groove structure is formed in a plurality of passivation films, the sizes of the groove structure in respective passivation films may be the same. In other embodiments of this disclosure, in the event that the above-described groove structure is formed in a plurality of passivation films, the sizes of the groove structure in respective passivation films may gradually decrease downwards from the top of the passivation layer.

In addition, in the prior art, monitoring patterns such as measurement patterns, alignment marks and testing elements may be formed on the scribe lane areas 120. In order not to affect the monitoring patterns by the groove structure of this disclosure, in some embodiments of this disclosure, the groove structure may not be formed in regions on the scribe lane areas 120 where monitoring patterns are to be disposed.

As described above, the semiconductor wafer may have a plurality of metal layers such as the metal layers 230 and 240, the top metal layer 250 (see FIGS. 2A and 2B). The plurality of metal layers are formed in die areas. However, in order to improve the uniformity of layer thickness, layer reflection or the like during subsequent processes, some or all of the plurality of metal layers may also be formed in the scribe lane areas (i.e., the so-called dummy metal materials). In the case the dummy metal materials are formed in the scribe lane areas, the dummy metal materials are likely to adhere to the blade when the die sawing process is carried out. Therefore, in some embodiment of this disclosure, the scribe lane areas may have no dummy metal material therein, which is advantageous for further improving the cutting quality of the dies.

In addition, as shown in FIGS. 2A and 2B, for the purpose of electrical connection in a subsequent packaging process, pad windows are formed in the passivation layer 260 (the pad windows are usually located on the dies, but can also be located on the scribe lane areas so as to be used as the above-described monitoring patterns for monitoring process stability or the like rather than to be used for bonding) so as to form pads therein.

For instance, in order to form the structure shown in FIG. 2A, the passivation layer 260 is formed on the planarized top metal layer 250 by deposition or the like. Next, a patterning process comprising, for example, photolithography, etching and cleaning is performed on the passivation layer 260 to form a pad window with respect to the top metal layer 250. Then, a pad 265 is formed in the pad window by, for example, deposition and patterning of a metal such as Al.

For instance, in order to form the structure shown in FIG. 2B, the bottom passivation film 261 is formed on the planarized top metal layer 250 by deposition or the like. Next, a patterning process is performed on the bottom passivation film 261 so as to form a pad window with respect to the top metal layer 250. Then, a pad is formed in the pad window by, for example, deposition and patterning of a metal such as Al. Finally, a top passivation film 262 is deposited and patterned so as to form a pad window, thereby the pad 268 is exposed.

Incidentally, in the case of the passivation layer 260 comprising only one passivation film as shown in FIG. 2A, the pad 265 is likely to break away in the die packaging process. In comparison to this, in the case of the passivation layer 260 comprising two passivation films as shown in FIG. 2B, since the pad 268 is held by the top passivation film 262, it is not likely to break away in the die packaging process. In the case the passivation layer 260 comprises more passivation films, a similar effect can be achieved as well.

As described above, for the purpose of electrical connection in a subsequent packaging process, pad windows are usually formed in the passivation layer. Therefore, in some embodiments of this disclosure, the above-described groove structure may be formed in the passivation layer while a pad window is formed in the passivation layer (although this disclosure is not limited thereto). This can be achieved by forming openings at locations corresponding to the pad window and the groove structure in a mask used for the patterning process of the passivation layer, for example. Similarly, in some embodiments of this disclosure, in the case the passivation layer comprises n passivation films, the above-described groove structure may be formed in each passivation film of m passivation films from the top of the passivation layer while a pad window is formed in the each passivation film, where m and n are natural numbers, n≥2, 1≤m≤n. In this manner, the formation of the groove structure of this disclosure does not need any additional mask and processing step, thus may not cause any disadvantageous effect on the productivity of the dies. In comparison to this, if the groove structure of this disclosure is formed by laser grooving, cost and time will be increased for manufacturing of the dies.

Incidentally, for instance, in the case the passivation layer 260 comprising two passivation films 261 and 262 is formed as shown in FIG. 2B and the pad window and the above-described groove structure are simultaneously formed in the top passivation film 262, since the etching selectivity of the pad 268 with respect to the top passivation film 262 is usually higher than the etching selectivity of the bottom passivation film 261 with respect to the top passivation film 262 during the etching process of the top passivation film 262, the depth of the formed groove structure is usually larger than the thickness of the top passivation film 262, that is, the formed groove structure usually can extend into the bottom passivation film 261. The same is true in the case the passivation layer comprises more passivation films. However, as described above, chippings or cracks generated during the die sawing process can be reduced as long as the above-described groove structure is formed in the passivation layer, regardless of the depth of above-described groove structure formed.

In addition, after forming the above-described groove structure, cutting may be performed along the grooves so as to singulate the plurality of dies 110 from each other.

According to the processing method for the semiconductor wafer of this disclosure as described above, a semiconductor wafer thus formed may include a plurality of dies formed on the semiconductor wafer in row and column directions and separated from each other by scribe lane areas; and a passivation layer formed on the plurality of dies and the scribe lane areas, wherein a groove structure is formed in the passivation layer, the groove structure comprising grooves formed along the scribe lane areas, and corners of the passivation layer at intersections of the grooves being removed.

From the above teaching, a person skilled in the art readily knows that the semiconductor wafer and the processing method therefor disclosed in embodiments of the present invention are capable of reducing chippings or cracks generated during the die-sawing process.

Up to now, the semiconductor wafer and the processing method therefor according to embodiments of this disclosure have been described in detail. Some details well known in the art are not described in order to avoid obscuring the concept of this disclosure. Persons skilled in the art can thoroughly understand how to implement the technical solutions disclosed herein according to the above description.

While this disclosure has been described with reference to exemplary embodiments, it shall be understood that this disclosure is not limited to the disclosed exemplary embodiments. It is obvious to persons skilled in the art that the above exemplary embodiments may be modified without deviating from the scope and spirit of this disclosure. The scope of the appended claims shall be accorded with the broadest interpretation so as to encompass all such modifications and equivalent structures and functions.

What is claimed is:

1. A semiconductor wafer, comprising:
   a plurality of dies formed on the semiconductor wafer in row and column directions and separated from each other by scribe lane areas; and
   a passivation layer formed on the plurality of dies and the scribe lane areas,
   wherein a groove structure is formed in the passivation layer, the groove structure comprising a plurality of grooves formed along the scribe lane areas, and wherein corner regions of the passivation layer at intersections of the grooves are removed and corner regions of the dies are exposed.

2. The semiconductor wafer according to claim 1, wherein in the case the passivation layer comprises n passivation films, the groove structure is formed in m passivation films from a top of the passivation layer, where m and n are natural numbers, n≥2, 1≤m≤n.

3. The semiconductor wafer according to claim 2, wherein in the case the groove structure is formed in a plurality of passivation films, the sizes of the groove structure in respective passivation films are the same.

4. The semiconductor wafer according to claim 2, wherein in the case the groove structure is formed in a plurality of passivation films, the sizes of the groove structure in the respective passivation films gradually decrease downwards from the top of the passivation layer.

5. The semiconductor wafer according to claim 1, wherein the removed corner regions of the passivation layer comprise right-angled isosceles triangular shapes from a plan view.

6. The semiconductor wafer according to claim 1, wherein the corner regions of the passivation layer are located within the scribe lane areas before being removed.

7. The semiconductor wafer according to claim 1, wherein the corner regions of the passivation layer cover the corner regions of corresponding dies before being removed.

8. The semiconductor wafer according to claim 1, wherein the grooves are formed in a middle region of the scribe lane areas.

9. The semiconductor wafer according to claim 1, wherein the grooves comprise a width in the range from 10 μm to 50 μm.

10. The semiconductor wafer according to claim 9, wherein the width of the grooves ranges from 25 μm to 40 μm.

11. The semiconductor wafer according to claim 1, wherein the scribe lane areas have no dummy metal material therein.

12. The semiconductor wafer according to claim 1, wherein the groove structure is not formed at regions on the scribe lane areas where monitoring patterns are to be disposed.

13. A method for processing a semiconductor wafer, the method comprising:
   forming a plurality of dies on the semiconductor wafer in row and column directions, where in the plurality of dies are separated from each other by scribe lane areas;
   forming a passivation layer on the plurality of dies and the scribe lane areas; and forming a groove structure in the passivation layer, wherein the groove structure comprises a plurality of grooves formed along the scribe lane areas, and wherein corner regions of the passivation layer at intersections of the grooves are removed and corner regions of the dies are exposed.

14. The method according to claim 13, wherein the groove structure is formed in the passivation layer while a pad window is formed in the passivation layer.

15. The method according to claim 13, wherein in the case the passivation layer comprises n passivation films, forming the groove structure in the passivation layer comprises forming the groove structure in m passivation films from a top of the passivation layer, where m and n are natural numbers, $n \geq 2$, $1 \leq m \leq n$.

16. The method according to claim 15, wherein the groove structure is formed in each passivation film of the m passivation films from the top of the passivation layer while a pad window is formed in each passivation film.

17. The method according to claim 15, wherein in the case the groove structure is formed in a plurality of passivation films, the sizes of the groove structure in respective passivation films are the same.

18. The method according to claim 15, wherein in the case the groove structure is formed in a plurality of passivation films, the sizes of the groove structure in the respective passivation films gradually decrease downwards from the top of the passivation layer.

19. The method according to claim 13 further comprising cutting along the grooves after forming the groove structure to singulate the plurality of dies.

20. The method according to claim 13, wherein the removed corner regions of the passivation layer comprise right-angled isosceles triangle shapes from a plan view.

21. The method according to claim 13, wherein the corner regions of the passivation layer are located within the scribe lane areas before being removed.

22. The method according to claim 13, wherein the corner regions of the passivation layer cover the corner regions of corresponding dies before being removed.

23. The method according to claim 13, wherein the grooves are formed in middle region of the scribe lane areas.

24. The method according to claim 13, wherein the grooves comprise a width ranging from 10 μm to 50 μm.

25. The method according to claim 24, wherein the width of the grooves ranges from 25 μm to 40 μm.

26. The method according to claim 13, wherein the scribe lane areas have no dummy metal material therein.

27. The method according to claim 13, wherein the groove structure is not formed at regions on the scribe lane areas where monitoring patterns are to be disposed.

* * * * *